(12) United States Patent
Juang

(10) Patent No.: US 6,388,477 B1
(45) Date of Patent: May 14, 2002

(54) SWITCHABLE VOLTAGE FOLLOWER AND BRIDGE DRIVER USING THE SAME

(75) Inventor: Dar-Chang Juang, Hsinchu (TW)

(73) Assignee: Sunplus Technology Col, Ltd., Hsin-Chu (TW)

( * ) Notice: Subject to any disclaimer, the term of this patent is extended or adjusted under 35 U.S.C. 154(b) by 0 days.

(21) Appl. No.: 09/892,763

(22) Filed: Jun. 28, 2001

(51) Int. Cl.[7] .................................. H03B 1/00
(52) U.S. Cl. .................. 327/112; 327/424; 327/508; 360/46; 360/68; 326/27; 326/82
(58) Field of Search .................. 327/108–112, 423, 327/424, 419, 448, 508, 588; 330/146, 51, 84, 124 R; 360/46, 67, 68; 363/63, 58; 326/26–28, 82, 83–88; 307/412

(56) References Cited

U.S. PATENT DOCUMENTS 5,422,587 A * 6/1995 Pulvirenti et al. .......... 327/389
5,430,400 A * 7/1995 Herlein et al. .............. 327/108
5,621,352 A * 4/1997 Botti et al. ............... 330/124 R
5,805,020 A * 9/1998 Danz et al. ................. 330/10
5,939,909 A * 8/1999 Callahan, Jr. ............... 327/108

* cited by examiner

Primary Examiner—Kenneth B. Wells
Assistant Examiner—Minh Nguyen
(74) Attorney, Agent, or Firm—Bacon & Thomas, PLLC

(57) ABSTRACT

A switchable voltage follower and a bridge driver that utilizes the voltage follower. The voltage follower has an output transistor pair, three switching devices and an operational amplifier. Each of the switching devices is controlled by a polarity terminal for switching the circuit to be a pull-up voltage follower or a pull-down voltage follower. The bridge driver is formed by two switchable voltage followers to provide a bridge push-pull driving capability by driving the two switchable voltage followers alternately.

12 Claims, 9 Drawing Sheets

SWITCHABLE VOLTAGE FOLLOWER AND BRIDGE DRIVER USING THE SAME

BACKGROUND OF THE INVENTION

1. Field of the Invention

The present invention relates to the field of driving circuit and, more particularly, to a switchable voltage follower and a bridge driver that utilizes the voltage follower.

2. Description of Related Art

FIGS. 8A and 8B show a conventional pulse width modulation (PWM) bridge driver and its driving waveforms, respectively. As shown in the figure, the PWM up (PWM-UP) signal and PWM down (PWM-DOWN) signal are applied to the cross-connected transistors MP1, MN1, MP2 and MN2 to drive a speaker for being transformed into an audio output by the low pass filtering characteristic of the speaker. The structure of such a bridge driving amplifier is quite simple and can operate with a low voltage to produce an output with a relatively large volume. However, as the voltage supply VDD swings, the variation of the output volume is quite large. When the voltage supply VDD is high, the output current is large, and thus a large transient noise is easy to be produced in the integrated circuit, which is likely to result in malfunctions of the integrated circuit, for example, erroneously trigging the power on reset. In addition, because the layout of the transistors MP1, MN1, MP2 and MN2 may not be symmetric, or the conducting resistance of the transistors MP1 and MN1 may be different from that of the transistors MP2 and MN2 due to the drift of the process, an asymmetric distortion will be encountered.

FIG. 9 illustrates a bridge amplifier used in an audio processing integrated circuit to drive a speaker, wherein the data (b0~b10) output from a digital audio processing circuit is transformed into analog signal by a digital to analog converter 91 (DAC). Then, the analog signal is converted by a single ended to differential output converter 92 to a positive signal V1 and a negative signal V2 to drive two class AB amplifiers 93 and 94, uses as drivers, respectively. These two drivers thus output audio driving signal for driving the speaker 95.

The circuit structure of the aforementioned single ended to differential output converter 92 and two class AB amplifiers 93 and 94 of the bridge amplifier is illustrated in FIG. 10. The advantage is such that the circuit can drive the speaker in single ended configuration, or the circuit can be set in bridge configuration to drive the speaker with four-time output power. However, the single ended to differential output converter 92 will produce an offset, and thus the two operational amplifiers OPU and OPB in the two class AB amplifiers 93 and 94 are likely to cause a DC offset. Such a DC offset will apply a DC component to the speaker 95, and cause an extra consumption of static current. As a result, there is encountered a problem in having an over-large DC offset at the bridge output (SPK+, SPK−).

Moreover, the product of the static bias current of the transistors MN1 and MP1 of the class AB amplifiers 93 and 94 in the aforementioned bridge amplifier and the resistance of the speaker must be greater than the DC offset of the bridge output (SPK+, SPK−); otherwise, there will be a crossover distortion. Such a distortion is suppressed by the feedback of the bias control circuit 96 (a detained description of such can be found in U.S. Pat. No. 4,963,83). However, because the bias control circuit 96 is used to provide negative local feedback, the open loop gain of the class AB amplifier will be lowered by 10~20 times. Therefore, the amount of feedback is not large enough to suppress the crossover distortion. FIG. 11 shows the input waveform VIN of the bridge amplifier and output waveform $(V_{SPK+}-V_{SPK-})$ of the bridge output (SPK+, SPK−), which depicts that there is an obvious crossover distortion in the bridge output waveform $(V_{SPK+}-V_{SPK-})$. Accordingly, there is a need for the above conventional bridge amplifier to be improved.

SUMMARY OF THE INVENTION

The object of the present invention is to provide a switchable voltage follower and a bridge driver using the same for mitigating and/or obviating the problems in the conventional skill.

In accordance with one aspect of the present invention, there is provided a switchable voltage follower, which comprises: an output transistor pair having a PMOS transistor and a NMOS transistor, each having a drain connected together for being used as a driving output terminal; a first, a second and a third switching devices, each having a first input terminal, a second input terminal and an output terminal, the first input terminal of the second switching device being connected to a voltage supply, the output terminal of the second switching device being connected to a gate of the PMOS transistor, the second input terminal of the third switching device being connected to a system low voltage, the output terminal of the third switching device being connected to a gate of the NMOS transistor; and an operational amplifier having a positive input connected to the driving output terminal, a negative input connected to the output terminal of the first switching device, and an output connected to the second input terminal of the second switching device and the first input terminal of the third switching device, wherein, each of the switching devices is controlled by a polarity terminal in such a manner that, when the polarity terminal is in a first logic state, the output terminal of each switching device is connected to its first input terminal, and when the polarity terminal is in a second logic state, the output terminal of each switching device is connected to its second input terminal.

In accordance with another aspect of the present invention, there is provided with a bridge driver having a first and a second switchable voltage followers. Each switchable voltage follower comprises: an output transistor pair having a PMOS transistor and a NMOS transistor, each having a drain connected together for being used as a driving output terminal; a first, a second and a third switching devices, each having a first input terminal, a second input terminal and an output terminal, the first input terminal of the second switching device being connected to a voltage supply, the output terminal of the second switching device being connected to a gate of the PMOS transistor, the second input terminal of the third switching device being connected to a system low voltage, the output terminal of the third switching device being connected to a gate of the NMOS transistor, the first and second input terminals of the first switching device being provided as an input low terminal and an input high terminal, respectively, wherein each of the switching devices is controlled by a polarity termonal in such a manner that, when the polarity terminal is in a first logic state, the output terminal of each switching device is connected to its first input terminal, and when the polarity terminal is in a second logic state, the output terminal of each switching device is connected to its second input terminal; and an operational amplifier having a positive input connected to the driving output terminal, a negative input connected to the output terminal of the first switching device, and an output connected to the second input terminal of the second switching device and the first input terminal of the third switching device, wherein, the input low terminals of the first and second switchable voltage followers are connected together for being used as a voltage input low terminal; the input high terminals of the first and second switchable voltage followers are connected together for being used as a voltage input high terminal; the polarity terminals of the two switchable voltage followers are inputted with a polarity switching signal and an inverse polarity switching signal, respectively.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
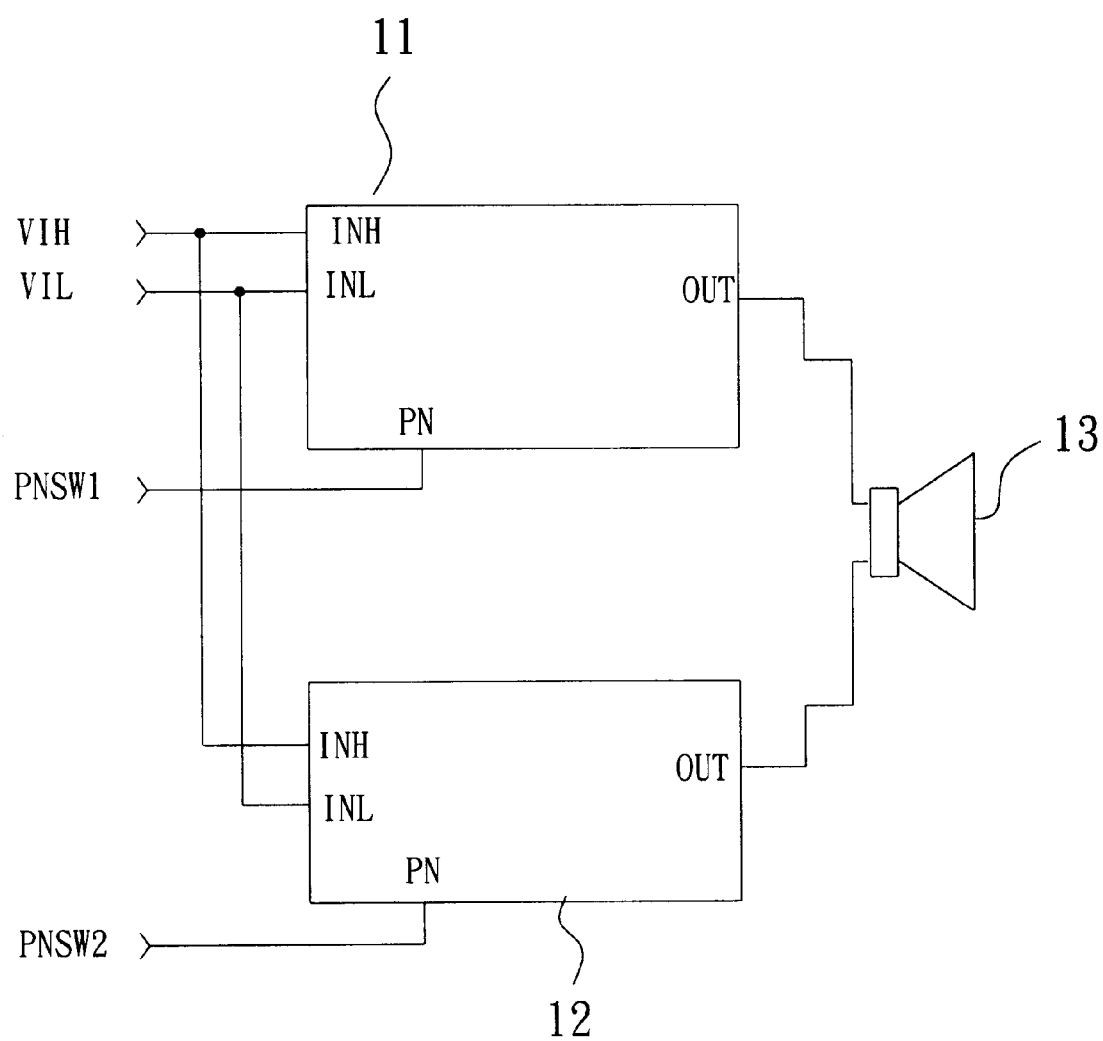
FIG. 1 is the functional block diagram of a bridge driver in accordance with the present invention.
Figure 2:
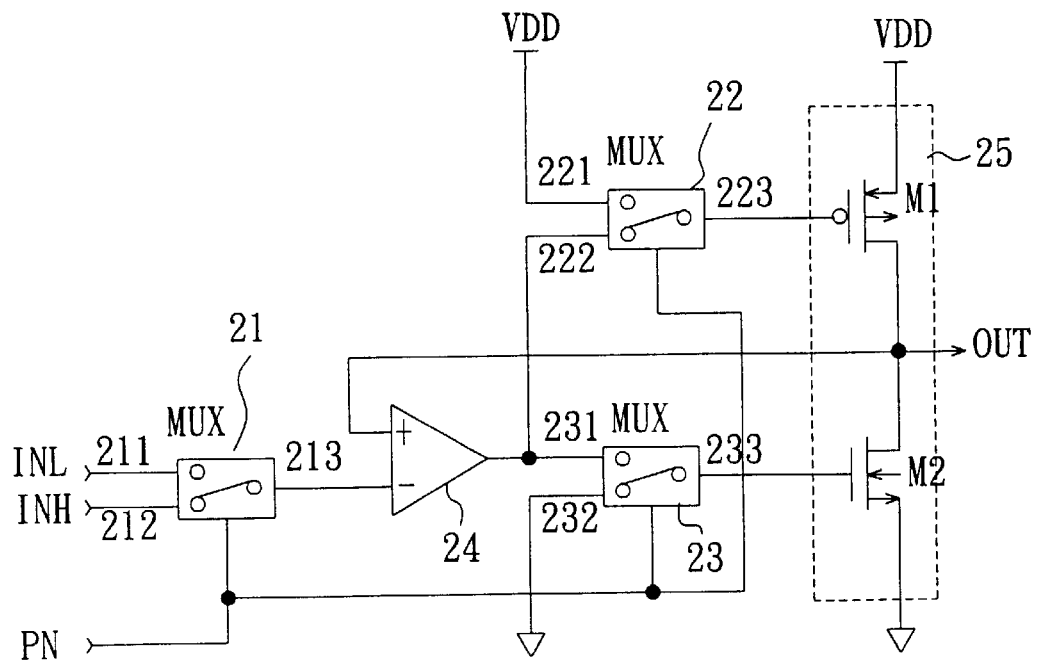
FIG. 2 is the circuit diagram of a switchable voltage follower in accordance with the present invention.

Referring now to FIG. 1, there is illustrated a block diagram of the bridge driver in accordance with a preferred embodiment of the present invention. As shown, the bridge amplifier has two switchable voltage followers 11 and 12. The circuit structure of each switchable voltage follower is show in FIG. 2, which includes an operational amplifier (OP) 24, three switching devices 21~23 and an output transistor pair 25. The output transistor pair has a PMOS transistor M1 and a NMOS transistor M2, used as output devices, and the drains of transistors M1 and M2 are connected together for being used as a driving output terminal (OUT) of the switchable voltage follower.

Preferably, the aforementioned switching devices 21~23 are 2-to-1 multiplexers (MUX) controlled by a polarity terminal PN. When a digital signal of logic 0 enters to the polarity terminal PN, the output terminals 213, 223 and 233 of the switching devices 21~23 are switched to connect to the first input terminals 211, 221 and 231, respectively. When a digital signal of logic 1 enters the polarity terminal PN, the output terminals 213, 223 and 233 of the switching devices 21~23 are switched to connect to the second input terminals 212, 222 and 232, respectively.

The aforementioned operational amplifier 24 is a fill rail-to-rail differential amplifier. The positive input of the operational amplifier 24 is used as a feedback terminal and connected to the driving output terminal (OUT). The negative input of the operational amplifier 24 is connected to the output terminal of the switching device 213 to amplify an input signal. The output of the operational amplifier 24 is connected to the first input terminal 231 of the switching device 23 and the second input terminal 222 of the switching device 22. The first input terminal 221 of switching device 22 is connected to the voltage supply VDD and the output terminal 223 is connected to the gate of the transistor M1. The second input 232 of switching device 23 is connected to the system low voltage VSS and the output terminal 233 is connected to the gate of the transistor M2. The first and second input terminals 211 and 212 of the switching device 21 are provided as an input low terminal INL and an input high terminal INH of the switchable voltage follower, respectively.

With the circuit structure of the aforementioned switchable voltage followers 11 and 12, when PN=1, the negative input of the operational amplifier 24 is connected to the input high terminal INH; the output of the operational amplifier 24 is connected to the gate of the transistor M1; and the drain of the transistor M1 is connected to the feedback terminal of the operational amplifier 24. Therefore, there is formed a pull-up voltage follower, and the transistor M2 is turned off because its gate is connected to VSS. When PN=0, the negative input of the operational amplifier 24 is connected to the input low terminal INL; the output of the operational amplifier 24 is connected to the gate of the transistor M2; and the drain of transistor M2 is connected to the feedback terminal of the operational amplifier 24. Therefore, there is formed a pull-down voltage follower, and the transistor M1 is turned off because its gate is connected to VDD. From the above description, it is known that the switchable followers 11 and 12 can be switched into a desired configuration by using the polarity terminal PN to control the three switching devices 21~23.

Figure 3:
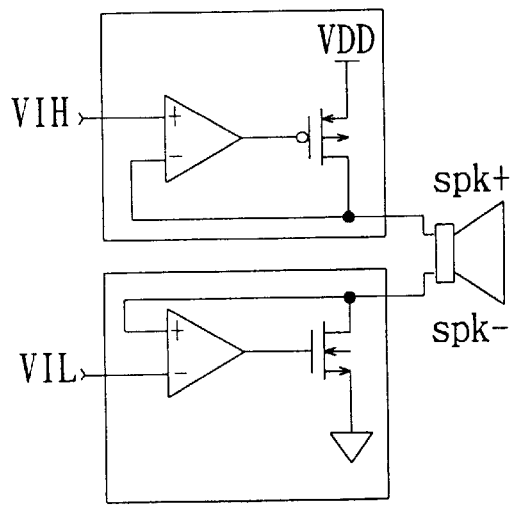
FIG. 3 shows a circuit configuration of the bridge driver in accordance with the present invention.
Figure 4:
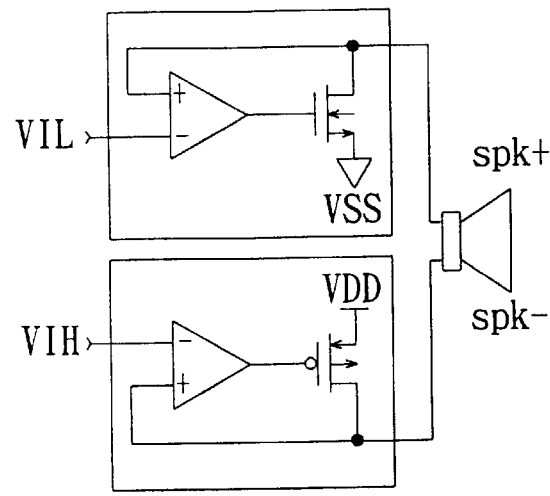
FIG. 4 shows another circuit configuration of the bridge driver in accordance with the present invention.

When two switchable voltage followers 11 and 12 are combined to form the bridge driver as shown in FIG. 1, the input low terminals INL of the switchable voltage followers 11 and 12 are both connected to a voltage input low terminal VIL, and the input high terminals INH of the switchable voltage followers 11 and 12 are both connected to a voltage input high terminal VIH. The polarity terminals PN of the switchable voltage followers 11 and 12 are denoted by a first polarity switch terminal PNSW1 and a second polarity switch terminal PNSW2, respectively. With the control of the polarity switch terminals PNSW1 and PNSW2, when PNSW1=1 and PNSW2=0, the switchable voltage followers 11 and 12 are configured as shown in FIG. 3, which respectively provide the pull-up and pull-down capabilities to drive speaker 13. On the contrary, when PNSW1=0 and PNSW2=1, the switchable voltage followers 11 and 12 are configured as shown in FIG. 4, which respectively provide the pull-down and pull-up capabilities to drive the speaker 13. Accordingly, it is able to provide the push-pull driving capability.

Figure 5A:
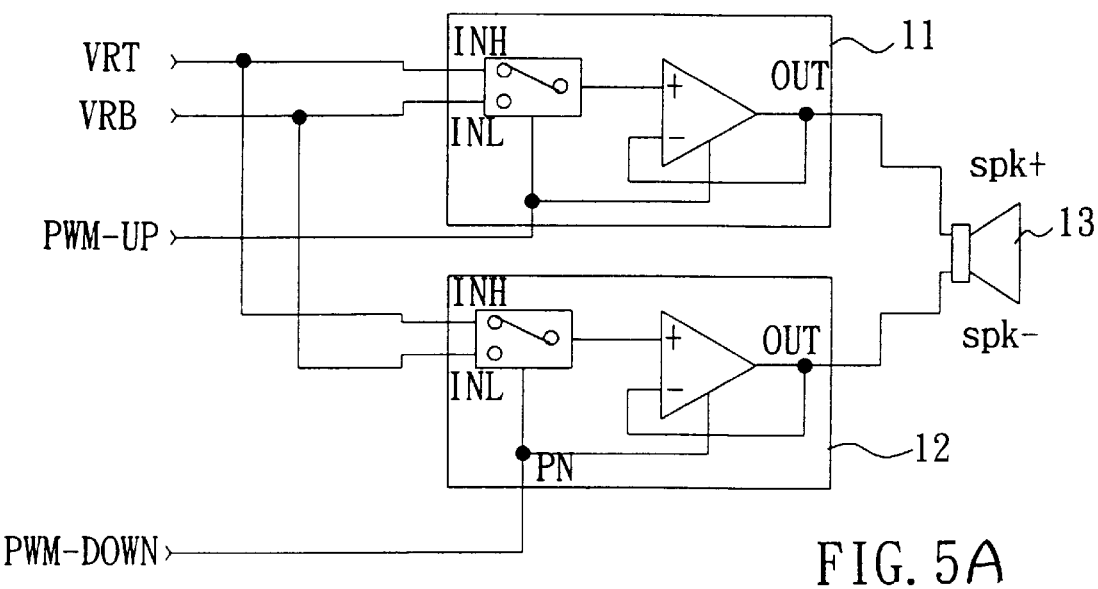
FIG. 5A is the circuit diagram of a PWM driver in accordance with the present invention.
Figure 5B:
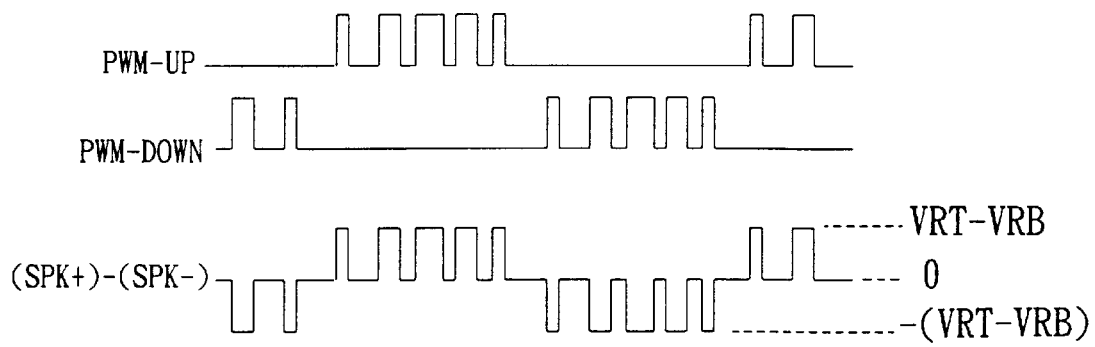
FIG. 5B shows the driving waveforms of the PWM driver shown in FIG. 5A.

The bridge driver that is formed by the aforementioned switchable voltage followers 11 and 12 can be used as PWM (pulse width modulation) driver. FIGS. 5A and 5B show the circuit diagram and driving waveform of such a PWM driver, respectively. In this PWN driver, the input high terminals INH of the switchable voltage followers 11 and 12 are both connected to reference top voltage VRT, and the input low terminals INL of the switchable voltage followers 11 and 12 are both connected to reference bottom voltage VBR, wherein the reference top voltage VRT is greater than the reference bottom voltage VRB. The polarity terminals PN of the switchable voltage followers 11 and 12 are connected to PWM-UP signal and PWM-DOWN signal, respectively. As shown in the figure, the signal that is applied to the speaker 13 is a PWM signal with a peak-to-peak voltage of 2*(VRT−VRB). This PWM driver has the following advantages:

(1) The voltage follower has a bandwidth as high as 1 MHz to easily drive PWM signals.

(2) When VDD is about higher than VRT+VRB+0.4V, the voltage that is outputted to the speaker 13 is a steady voltage with a peak-to-peak value of 2*(VRT−VRB), instead of 2*VDD, so as to be able to maintain a stable volume output. Therefore, in an application using a battery as a power source, the volume output will not be affected the variation of the battery power.

(3) The asymmetric offset of positive and negative output currents is derived from the DC offset between the two operational amplifiers being divided by (VRT−VRB), wherein the DC offset is less than 30 mV and (VRT−VRB) is greater than 2.0V. Thus, the asymmetric offset is less than 1.5%. On the contrary, the asymmetric offset of positive and negative output currents of the conventional PWM driver is usually as high as 5~10%. Therefore, the DC current loss and distortion caused by the PWM driver in accordance with the present invention are both smaller than those of the conventional PWM driver.

Figure 6:
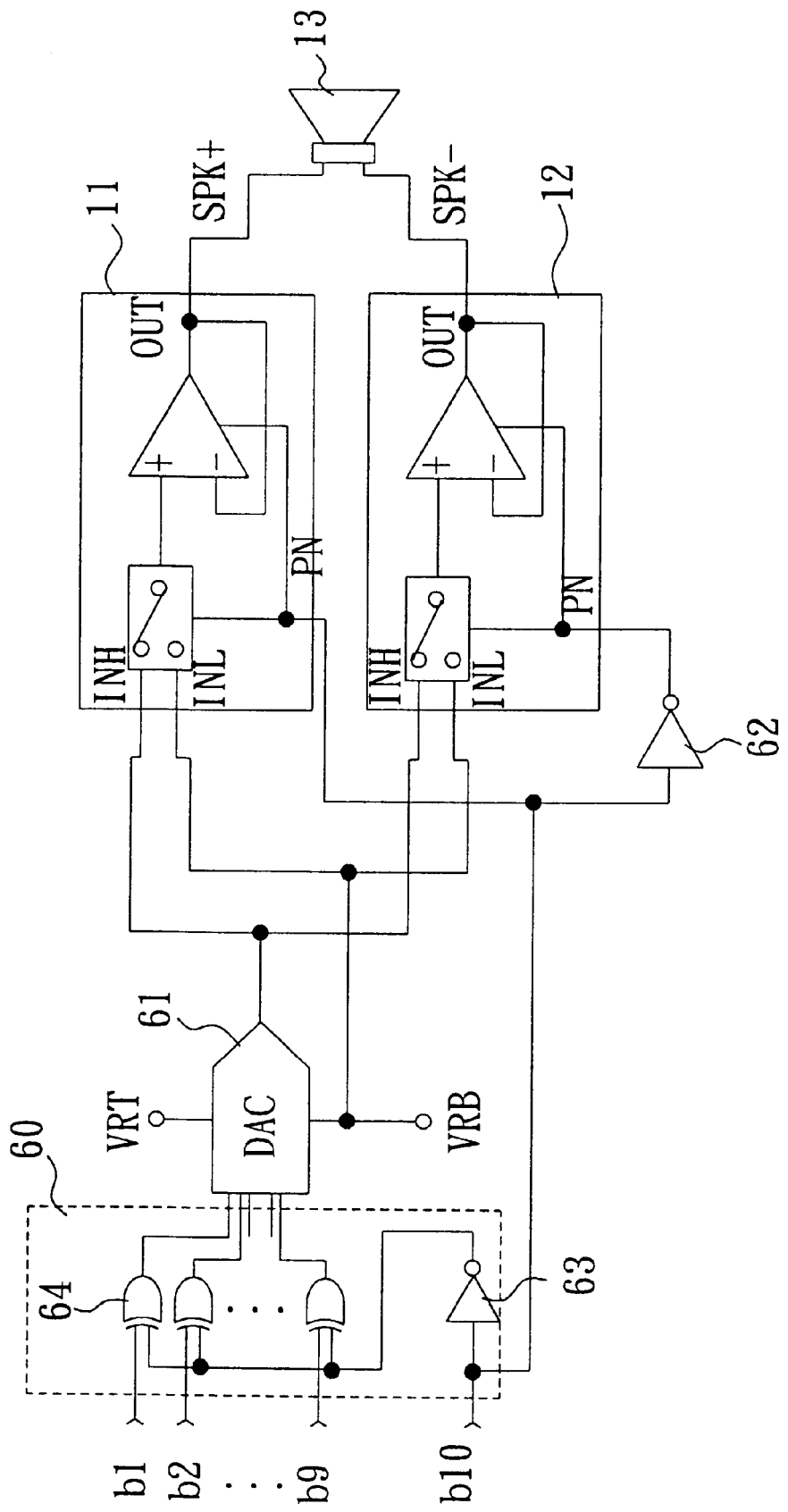
FIG. 6 shows an audio driver in accordance with the present invention.

FIG. 6 is a N-bit audio driver comprising a bridge driver, which is composed of the aforementioned switchable voltage followers 11 and 12, a digital-to-analog converter 61 (DAC) and a digital rectifying circuit 60. In the preferred embodiment, N is assumed to be 10. As shown in the figure, the input low terminals INL of the two switchable voltage followers 11 and 12 of the bridge driver are both connected to the reference bottom voltage VRB of the DAC 61. The input high terminals INH of the switchable voltage followers 11 and 12 are both connected to the output of the DAC 61.

The polarity terminal PN of the switchable voltage follower 11 is controlled by the most significant bit (MSB), denoted as b10, of the 10-bit input audio data, and the corresponding waveform is shown in FIG. 7B. Another polarity terminal PN of the switchable voltage follower 12 is connected to the bit b10 via an inverter 62 so as to be controlled by the inverse signal of the bit b10.

Figure 7:
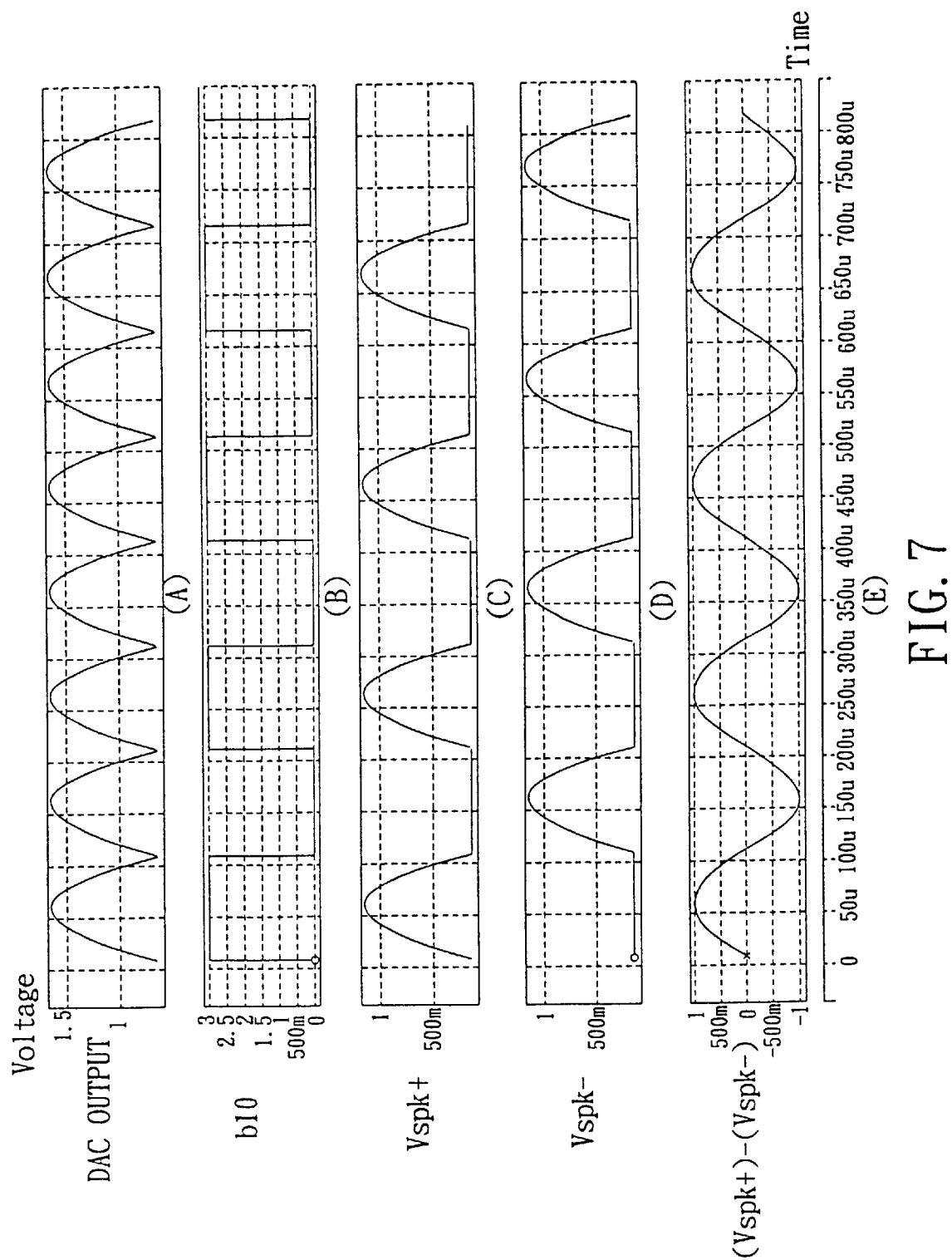
FIG. 7 shows the driving waveforms of the audio driver shown in FIG. 6.
Figure 8A:
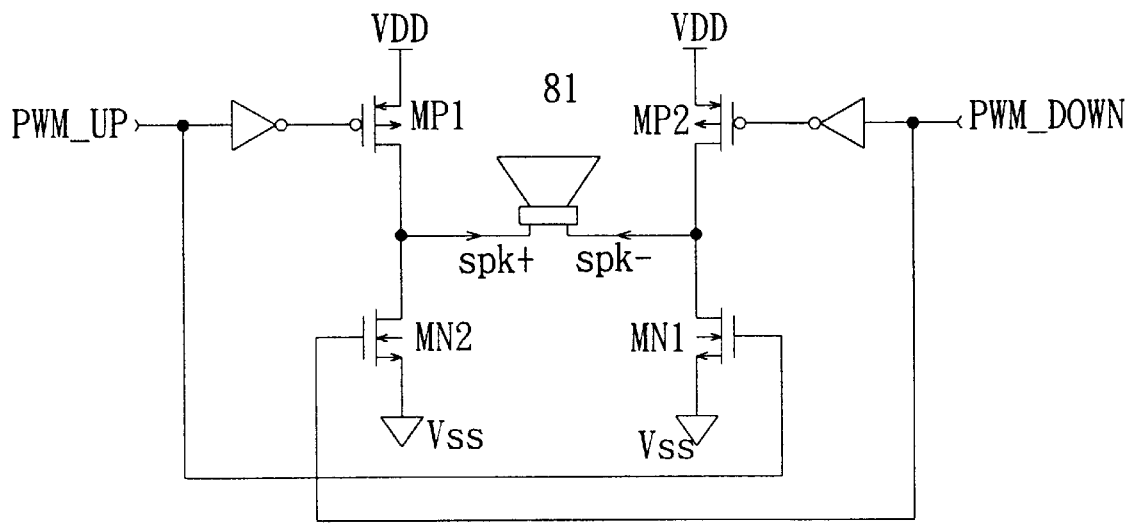
FIG. 8A is the circuit diagram of a conventional PWM bridge driver.
Figure 8B:
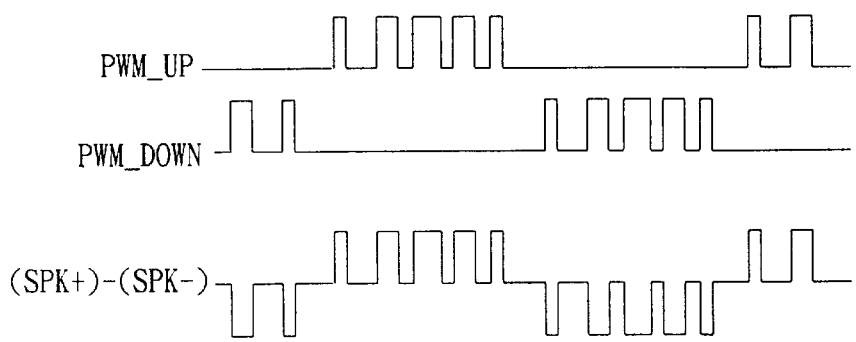
FIG. 8B shows the driving waveforms of the PWM bridge driver shown in FIG. 8A.
Figure 9:
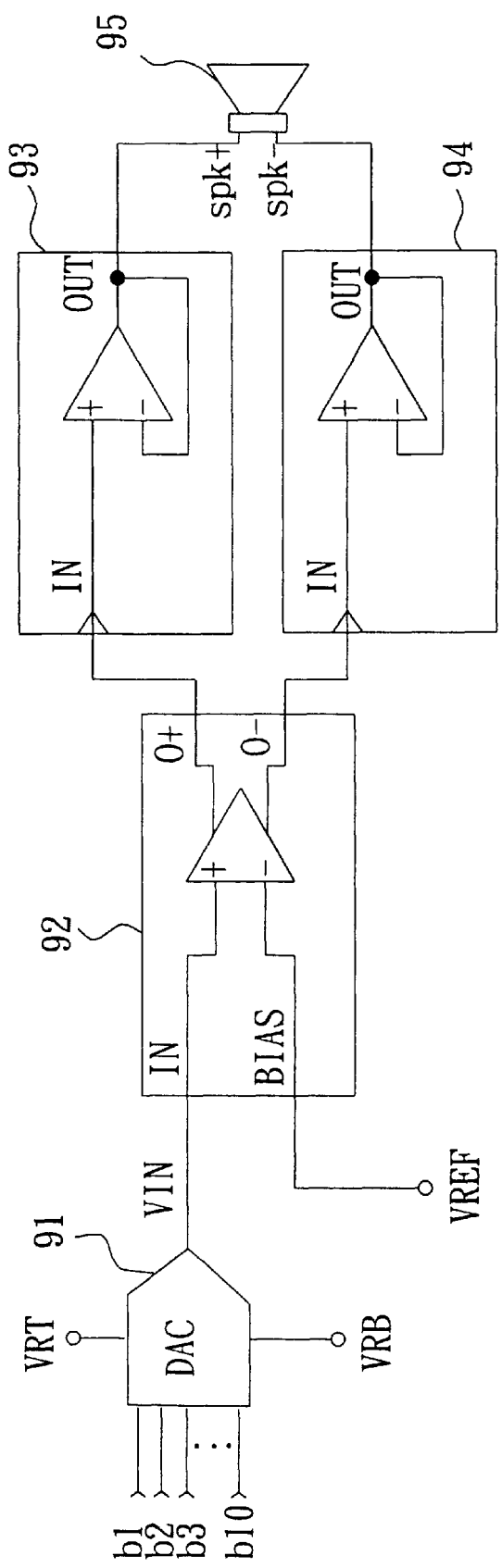
FIG. 9 is the circuit diagram of a bridge amplifier used in an audio processing IC to drive a speaker.
Figure 10:
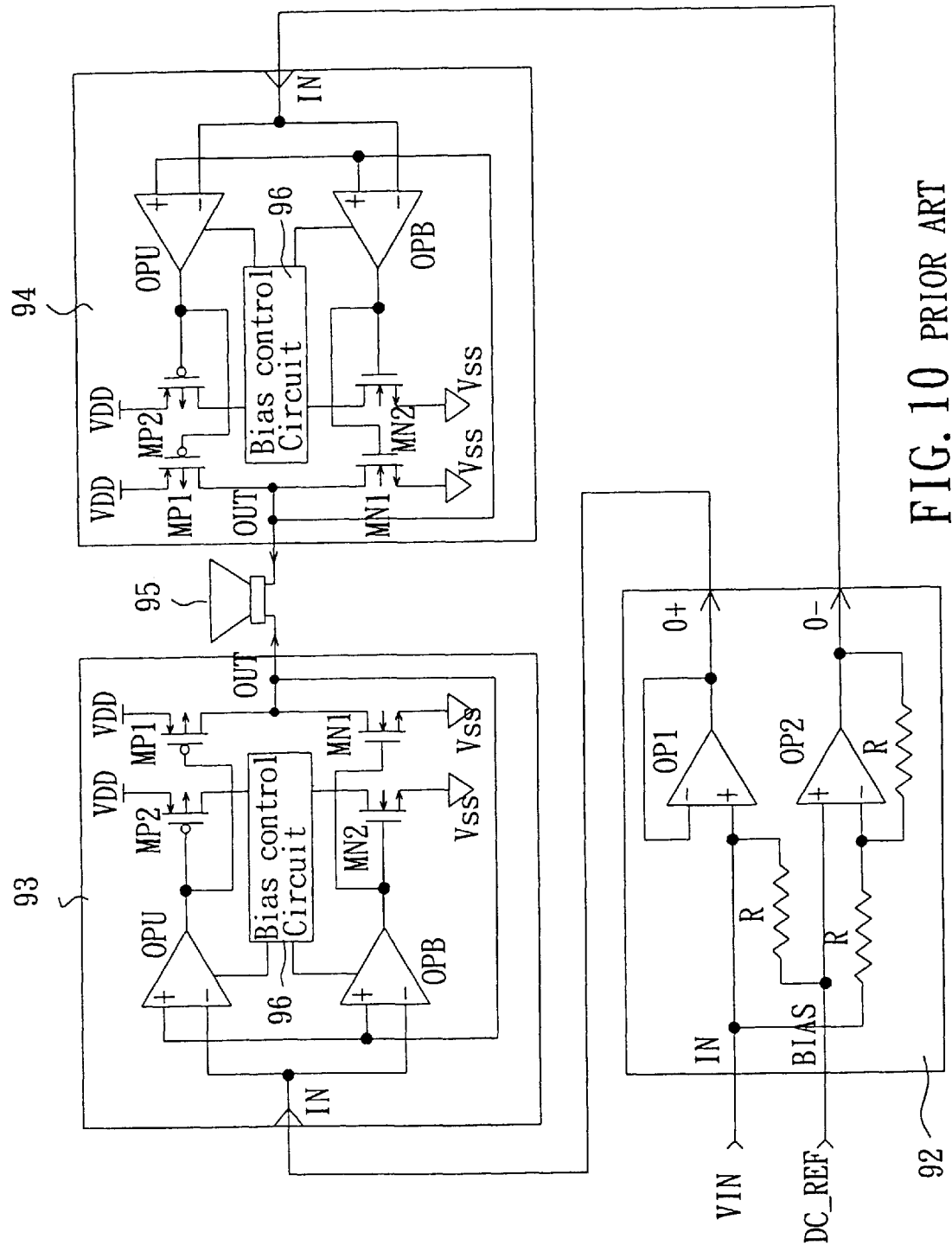
FIG. 10 is a detail circuit diagram of the bridge amplifier shown in FIG 9.
Figure 11:
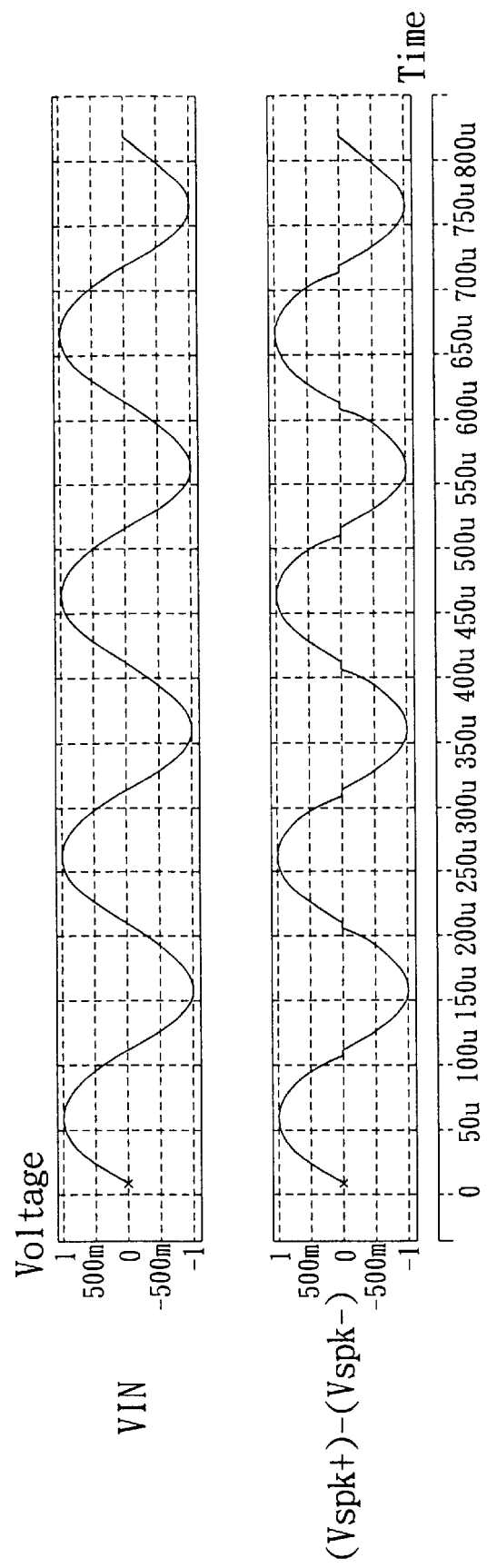
FIG. 11 shows the input and output waveforms of the bridge amplifier shown in FIG. 9.

The digital rectifying circuit 60 includes an inverter 63 and nine exclusive-OR gates 64 for providing an absolute value operation to the input digital audio data b1~b10 so as to output the absolute value of the digital data. The MSB b10 is connected to the nine exclusive-OR gates 64 through the inverter 63 for being EXOR-ed with the other 9 bits b1~b9 of the 10-bit input audio data, respectively, and the exclusive-OR results are inputted to the DAC 61. With such a design, it is able to use the middle voltage (1000000000) as a reference value to perform an absolute operation on the input audio data, such that the voltage converted by the DAC 61 is always positive, as shown in the FIG. 7, which can drive the input high terminals INH of the switchable voltage followers 11 and 12. As a result, the waveforms at the SPK+ and SPK− terminals are shown in FIGS. 7C and 7D, respectively, and the waveform ($V_{SPK+}-V_{SPK-}$) to drive the speaker 13 is that shown in FIG. 7E.

The aforementioned audio driver has the following advantages:

(1) It is able to have a N-bit resolution with only a (N-1)-bit DAC.

(2) There is no need to use a single end to differential converter.

(3) There are only two operational amplifiers required in whole bridge driver.

(4) The output DC offset is from the DC offset difference of the two operational amplifiers, and this value is far less than the DC offset of the conventional N-bit audio driver so that the resultant DC current loss is smaller.

(5). There is no DC offset generated because the class B voltage followers are used.

Although the present invention has been explained in relation to its preferred embodiment, it is to be understood that many other possible modifications and variations can be made without departing from the spirit and scope of the invention as hereinafter claimed.

What is claimed is:

1. A switchable voltage follower comprising:

an output transistor pair having a PMOS transistor and a NMOS transistor, each having a drain connected together for being used as a driving output terminal;

a first, a second and a third switching devices, each having a first input terminal, a second input terminal and an output terminal, the first input terminal of the second switching device being connected to a voltage supply, the output terminal of the second switching device being connected to a gate of the PMOS transistor, the second input terminal of the third switching device being connected to a system low voltage, the output terminal of the third switching device being connected to a gate of the NMOS transistor; and an operational amplifier having a positive input connected to the driving output terminal, a negative input connected to the output terminal of the first switching device, and an output connected to the second input terminal of the second switching device and the first input terminal of the third switching device, wherein, each of the switching devices is controlled by a polarity terminal in such a manner that, when the polarity terminal is in a first logic state, the output terminal of each switching device is connected to its first input terminal, and when the polarity terminal is in a second logic state, the output terminal of each switching device is connected to its second input terminal.

2. The switchable voltage follower as claimed in claim 1, wherein the operational amplifier is a full rail-to-rail differential amplifier.

3. The switchable voltage follower as claimed in claim 1, wherein the first logic state is logic 0 and the second logic state is logic 1.

4. The switchable voltage follower as claimed in claim 1, wherein the first and second input terminals of the first switching device are provided as an input low terminal and an input high terminal of the switch voltage follower, respectively.

5. The switchable voltage follower as claimed in claim 1, wherein each of the switching devices is a 2-to-1 multiplexer.

6. A bridge driver having a first and a second switchable voltage followers, each switchable voltage follower comprising:

an output transistor pair having a PMOS transistor and a NMOS transistor, each having a drain connected together for being used as a driving output terminal;

a first, a second and a third switching devices, each having a first input terminal, a second input terminal and an output terminal, the first input terminal of the second switching device being connected to a voltage supply, the output terminal of the second switching device being connected to a gate of the PMOS transistor, the second input terminal of the third switching device being connected to a system low voltage, the output terminal of the third switching device being connected to a gate of the NMOS transistor, the first and second input terminals of the first switching device being provided as an input low terminal and an input high terminal, respectively, wherein each of the switching devices is controlled by a polarity terminal in such a manner that, when the polarity terminal is in a first logic state, the output terminal of each switching device is connected to its first input terminal, and when the polarity terminal is in a second logic state, the output terminal of each switching device is connected to its second input terminal; and an operational amplifier having a positive input connected to the driving output terminal, a negative input connected to the output terminal of the first switching device, and an output connected to the second input terminal of the second switching device and the first input terminal of the third switching device, wherein, the input low terminals of the first and second switchable voltage followers are connected together for being used as a voltage input low terminal; the input high terminals of the first and second switchable voltage followers are connected together for being used as a voltage input high terminal; the polarity terminals of the first and second switchable voltage followers are inputted with a polarity switching signal and an inverse polarity switching signal, respectively.

7. The bridge driver as claimed in claim 6, wherein the input high terminals of the first and second switchable voltage followers are both connected to a reference top voltage; the input low terminals of the first and second switchable voltage followers are both connected to a reference bottom voltage; the polarity terminals of the first and second switchable voltage followers are inputted with a PWM up signal and a PWM down signal, respectively; and the reference top voltage is greater than the reference bottom voltage.

8. The bridge driver as claimed in claim 6, further comprising:

a digital rectifying circuit for performing an absolute value operation on input digital data and outputting an absolute value of the input digital data; and a digital-to-analog converter for converting the absolute value of the digital input data into a corresponding voltage at its output, wherein, the input low terminals of the first and second switchable voltage followers are both connected to a reference bottom voltage of the digital-to-analog converter; the input high terminals of the first and second switchable voltage followers are both connected to the output of the digital-to-analog converter; the polarity terminal of the first switchable voltage follower is controlled by the most significant bit of the input digital data and the polarity terminal of the second switchable voltage follower is controlled by an inverse signal of the most significant bit.

9. The bridge driver as claimed in claim 8, wherein, the digital rectifying circuit comprises an inverter and multiple exclusive-OR gates, and the most significant bit of the digital input data is connected to the exclusive-OR gates through the inverter for being EXOR-ed with the other bits of the digital input data, respectively and the exclusive-OR results are inputted to the digital-to-analog converter.

10. The bridge driver as claimed in claim 6, wherein the operational amplifier is a full rail-to-rail differential amplifier.

11. The bridge driver as claimed in claim 6, wherein the first logic state is a logic 0 and the second logic state is a logic 1.

12. The bridge driver as claimed in claim 6, wherein each of the switching devices is a 2-to-1 multiplexer.

* * * * *